(12) United States Patent
Hsu et al.

(10) Patent No.: US 10,962,285 B2
(45) Date of Patent: Mar. 30, 2021

(54) WAFER DRYING SYSTEM

(71) Applicant: Taiwan Semiconductor Manufacturing Co., Ltd., Hsinchu (TW)

(72) Inventors: Wei-Chun Hsu, Hsinchu (TW); Sheng-Wei Wu, Zhubei (TW); Shu-Yen Wang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 79 days.

(21) Appl. No.: 16/034,526

(22) Filed: Jul. 13, 2018

(65) Prior Publication Data

US 2020/0018549 A1 Jan. 16, 2020

(51) Int. Cl.
*F26B 21/14* (2006.01)
*H01L 21/67* (2006.01)
(52) U.S. Cl.
CPC ........ *F26B 21/14* (2013.01); *H01L 21/67034* (2013.01); *H01L 21/67253* (2013.01)
(58) Field of Classification Search
CPC ............... F26B 21/14; H01L 21/67034; H01L 21/67253
See application file for complete search history.

(56) References Cited

U.S. PATENT DOCUMENTS

| 5,419,351 A | * | 5/1995 | Ciari | B08B 3/04 |
| | | | | 134/105 |
| 2004/0056196 A1 | | 3/2004 | Yoshida et al. | |
| 2005/0211267 A1 | * | 9/2005 | Kao | H01L 21/67051 |
| | | | | 134/2 |
| 2007/0119486 A1 | | 5/2007 | Park et al. | |
| 2015/0206780 A1 | * | 7/2015 | Choi | H01L 21/67017 |
| | | | | 206/710 |
| 2018/0286726 A1 | * | 10/2018 | Rebstock | H01L 21/67359 |

* cited by examiner

*Primary Examiner* — Jessica Yuen
(74) *Attorney, Agent, or Firm* — Sterne, Kessler, Goldstein & Fox P.L.L.C.

(57) ABSTRACT

A wafer drying method to detect airborne molecular contaminants in a drying gas as a feedback parameter for a single wafer or multi-wafer drying process is provided. For example, the method includes dispensing in a wafer drying station a drying gas over one or more wafers; collecting the drying gas from an exhaust of the wafer drying station; determining the concentration of contaminants in the drying gas; re-dispensing the drying gas over the one or more wafers if the concentration of contaminants is higher than a baseline value; and transferring the one or more wafers out of the wafer drying station if the concentration is equal to or less than the baseline value.

20 Claims, 3 Drawing Sheets

WAFER DRYING SYSTEM

BACKGROUND

Production equipment used in semiconductor manufacturing can be a source of particles for wafers in an integrated circuit (IC) fabrication facility. During the wafer fabrication process, semiconductor wafers undergo numerous processing operations. The number of particles on a wafer's surface can increase during IC fabrication as the wafer is exposed to additional processing.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
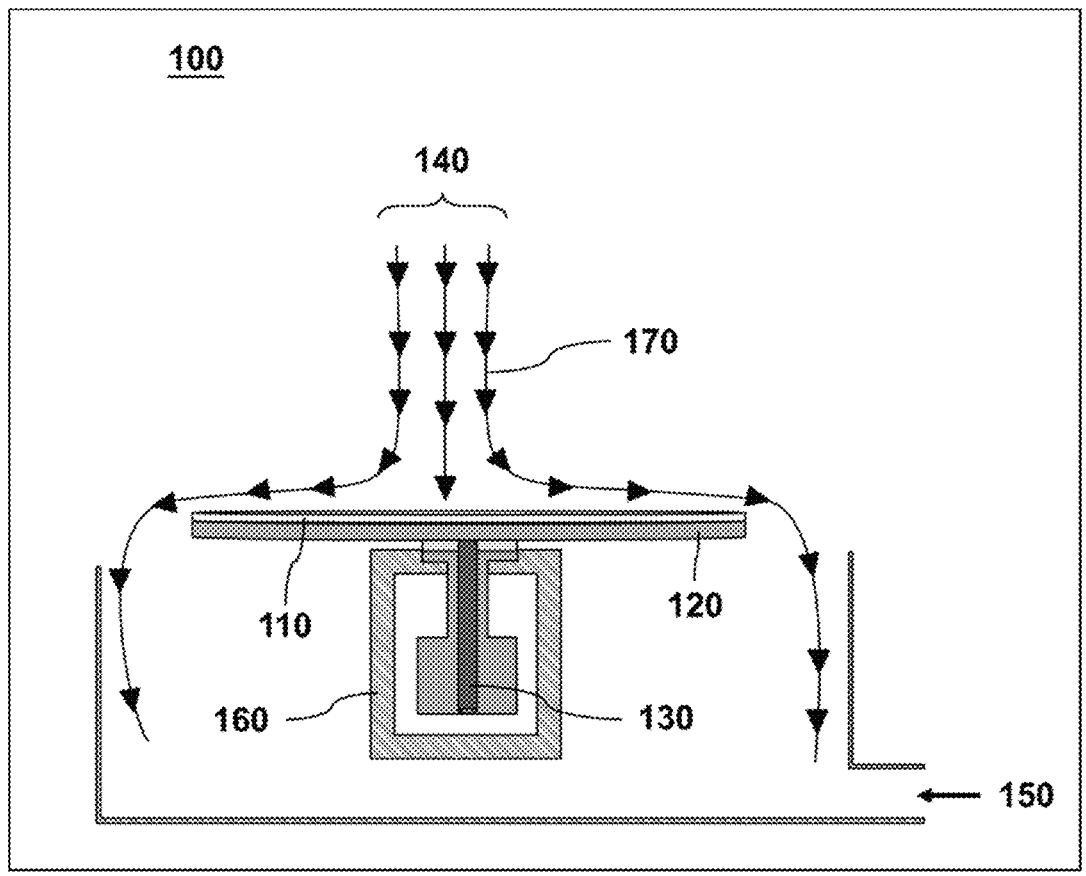
FIG. 1 is a schematic view of an a single wafer drying station, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by ±5% of the value.

The term "vertical," as used herein, means nominally perpendicular to the surface of a substrate.

One way to control wafer contamination from particles is to prevent contaminating the wafer during processing. However, this is not always possible, and once the wafer is contaminated, the contaminants may be removed by cleaning. The goal for the wafer cleaning process is to remove wafer surface contaminants, such as particles, organics (e.g., organic byproducts), metallics (traces of metals), and native oxides. The wafers in semiconductor manufacturing environment can be cleaned by dry cleaning methods, wet cleaning methods, or combinations thereof.

Wet cleaning methods can be performed in wet tools, which can handle either one wafer at a time (e.g., "single-wafer" tools) or large batches of wafers at once (e.g., "batch" tools). In a single-wafer tool, the wafer enters the cleaning module and is positioned on a wafer stage (holder). The wafer is then subjected to a wet cleaning method via one or more nozzles positioned above the wafer's surface. The one or more nozzles can flow chemicals (e.g., a chemical solution, deionized water, etc.) under pressure on the wafer's surface to remove the targeted contamination (e.g., particles, metallic contaminants, organic material, etc.). After the cleaning process, the wafer can be rinsed with DI water and dried via spinning, while an inert gas (such as nitrogen, helium, or clean dry air with a moisture content below −73° C. dew point, less than 1 part per million carbon dioxide, and/or less than 0.003 parts per million hydrocarbon vapor) is flown over the surface of the wafer to accelerate the drying process. In the case of batch tools, the wafers can be either submerged in one or more cleaning baths or be disposed into a sealed reactor, where an array of nozzles on reactor sidewalls can spray one or more chemical towards the surfaces of the wafers. The wafers can be subsequently rinsed with deionized water and dried with a method similar to that of the single wafer drying process. For the example, the wafers can be dried via spinning while an inert gas or clean dry air is flown over the surface of the wafers to accelerate the drying process.

Once the drying process is completed, the wafers can be removed from the wet cleaning tool. One or more wafers can be randomly selected to be screened for contaminants and particles to assess the efficiency of the wet cleaning process. The term "contaminants," as used herein, can either refer to any unwanted particles, organics, metallics, or native oxides on the wafer's surface that endured the wet cleaning process, or to chemical traces from the wet cleaning solutions used in the wet cleaning and drying processing (e.g., water spots, acids, derivatives of ammonia, etc.).

If the concentration of contaminants (e.g., the contamination level) on the wafer is elevated compared to an established baseline, the wafer can be "reworked" (e.g., it can be subjected to an additional cleaning cycle) or scrapped (e.g., discarded from the production line). The term "established baseline," as used herein, refers to a contamination level that has been deemed to have minimal impact on subsequent processing operations or have any appreciable impact on die yield loss. The aforementioned process can be both time consuming and costly because the contamination level is not measured concurrently (in real time) with the drying process—for example, the sampling process described above requires that the wafer (or wafers) be removed from the wet cleaning tool after the drying process, measured on a different tool (e.g., on a different part of the fabrication facility), and then returned to the wet cleaning tool for another round of cleaning, if necessary. In some cases, analysis for the selected few wafers can take a substantial amount of time (e.g., one or more hours) that can impact the overall chip production throughput.

This disclosure is directed to a wafer drying method that utilizes real-time detection of contaminants in a drying gas as a feedback parameter for a wafer drying process. More specifically, the method includes collecting the drying gas from a drying station, analyzing the drying gas to determine its airborne molecular contamination concentration and to compare the concentration to an established baseline. Based on the results of the comparison, the method can adjust the wafer drying process. For example, if the concentration of airborne molecular contamination in the drying gas is equal to or below the established baseline, the wafer (or wafers) can be removed from the drying station and transferred to the next processing operation. If the concentration of airborne molecular contamination is above the established baseline, an additional rinse (e.g., with deionized water) and dry cycle can be performed on the wafer (or wafers). Airborne molecular contamination is chemical contamination that can be incorporated into the drying gas in the form of vapors or aerosols. These chemicals can be organic or inorganic in nature and can include acids, bases, polymer additives, organometallic compounds, dopants, and the like. By way of example and not limitation, the airborne molecular contamination can include volatile organic compounds, amines, inorganic acids, acetone, sulfur dioxide ($SO_2$), isopropyl alcohol (IPA), water vapors (humidity), or any combination thereof.

FIG. 1 is a schematic view of a single-wafer drying station 100. In some embodiments, single-wafer drying station 100 is a module on a wet cleaning cluster tool (not shown in FIG. 1 for simplicity). The wet cleaning cluster tool may include additional components required for its operation. By way of example, such components can include, but are not limited to, additional modules (e.g., transfer modules, wet clean stations, etc.), robotic arms, pumps, exhaust lines, heating elements, gas and chemical delivery lines, mass flow controllers, gate valves, slot valves, hoses, external and internal electrical connections to other components of the cluster tool—such as computer units, chemical analyzers, controller units, pressure controllers, valves, pumps, and the like. These additional components may or may not be depicted in FIG. 1 for ease of illustration. However, these components are within the spirit and scope of this disclosure.

In single-wafer drying station 100, a wafer 110 rests on wafer holder 120. Wafer holder 120 attaches to a base 130, which can rotate wafer holder 120 and spin wafer 110 during the drying process. Drying station 100 can further include one or more gas outlets (not shown in FIG. 1), which can dispense one or more drying gases 140 above the surface of wafer 110, as shown in FIG. 1. In some embodiments, drying gas 140 can be dispensed from a central location above wafer 110 in a top down fashion, as shown in FIG. 1. However, this is not limiting and other configurations are possible depending on the design of single-wafer drying station 100. For example, drying gas 140 can be dispensed on wafer 110 at an angle from one or more locations or from a location on the sidewalls of drying station 100. Regardless of the configuration and the position of the gas outlet relative to the position of wafer 110, drying gas 140 can flow substantially parallel the surface of wafer 110 before exiting drying station 100 through exhaust line 150, as shown in FIG. 1. Base 130 and its rotating mechanism can be isolated from drying gas 140 via a cover 160. In some embodiments, a drying process involves spinning wafer 110 at a predetermined speed and concurrently dispensing drying gas 140 towards the surface of the wafer at a predetermined rate. Drying gases 140 that can be used in the wafer drying process include, but are not limited to, inert gases such as nitrogen, helium, and argon. Alternatively, clean dry air can be used as a drying gas.

By way of example and not limitation, the gas outlet(s) can be connected via one or more gas boxes to one or more external tanks that contain respective drying gases in high purity (above 99.999%) and under pressure. The gas boxes can be part of a gas distribution system where a network of gas valves and gas distribution lines are housed. The gas boxes and the external tanks are not shown in FIG. 1 for simplicity.

The illustration of drying station 100 in FIG. 1 is not limiting. For example, drying station 100 can be configured to perform additional operations, such as dispensing deionized water on the surface of wafer 110. For example, drying station 100 can be equipped with one or more nozzles connected to external chemical lines, not shown in FIG. 1 for simplicity. Alternatively, a wet cleaning station can perform the functions of drying station 100.

In some embodiments, drying station 100 can be designed to dry more than one wafer at a time (e.g., batches of wafers) using the same or similar principles described above. For example, drying station 100 can include a rotating wafer holder on which up to 25 wafers can be loaded at a time. In this configuration, and during the drying process, the drying gas can be dispensed from multiple locations of drying station 100 rather than from a top location. By way of example and not limitation, the drying gas can be dispensed from outlets located on the sidewalls of drying station 100. Regardless of the location of the gas outlets with respect to the surface of the wafers, the drying gas can be directed towards the surface of the wafers and can exit the drying station via one or more exhaust lines, such as the exhaust line 150.

As discussed above, and referring to FIG. 1, drying station 100 includes an exhaust line 150 though which drying gas 140 can exit from drying station 100. However, this is not limiting and drying station 100 can be equipped with more than one exhaust line. According to some embodiments, drying gas 140, once removed from drying station 100, can be diverted to an analytical unit that can measure the concentration of airborne molecular contamination in drying gas 140. Since drying gas 140 contacts the surface of wafer 110, traces of chemical signatures from the wet cleaning process can be incorporated in drying gas 140 in the form of airborne molecular contamination. By measuring the concentration of the airborne molecular contamination in drying gas 140, a system can determine whether wafer 110 needs to be "reworked"; for example, undergo another cycle of rinse and dry process in drying station 100. In some embodiments, collection and analysis of drying gas 140 is performed in real-time—for example, while wafer 110 is being dried in drying station 100. Further, in some embodiments, wafer 110 is not removed from drying station 100 until the contamination analysis on drying gas 140 has been completed and the analyzed concentration of airborne molecular contaminants is equal to or below an established baseline.

In some embodiments, the analytical unit is configured to detect more than one airborne molecular contaminant, including, but not limited to, volatile organic compounds, amines (e.g., derivatives of ammonia), acids, acetone, sulfuric oxide, isopropyl alcohol, water vapors, etc. By way of example and not limitation, the analytical unit can include a time of flight mass spectrometer (TOFMS) that can detect volatile organic compounds, an ion mobility spectrometer that can detect traces of amines or acids, humidity detectors, or other suitable detectors for the detection of desired airborne molecular contaminants. The detection limits can depend on the type of the detectable chemicals and the analytical method used for the chemical detection. In some embodiments, contamination concentration levels in the parts per trillion (ppt) or parts per million (ppm) can be measured by embodiments of the present disclosure.

Figure 2:
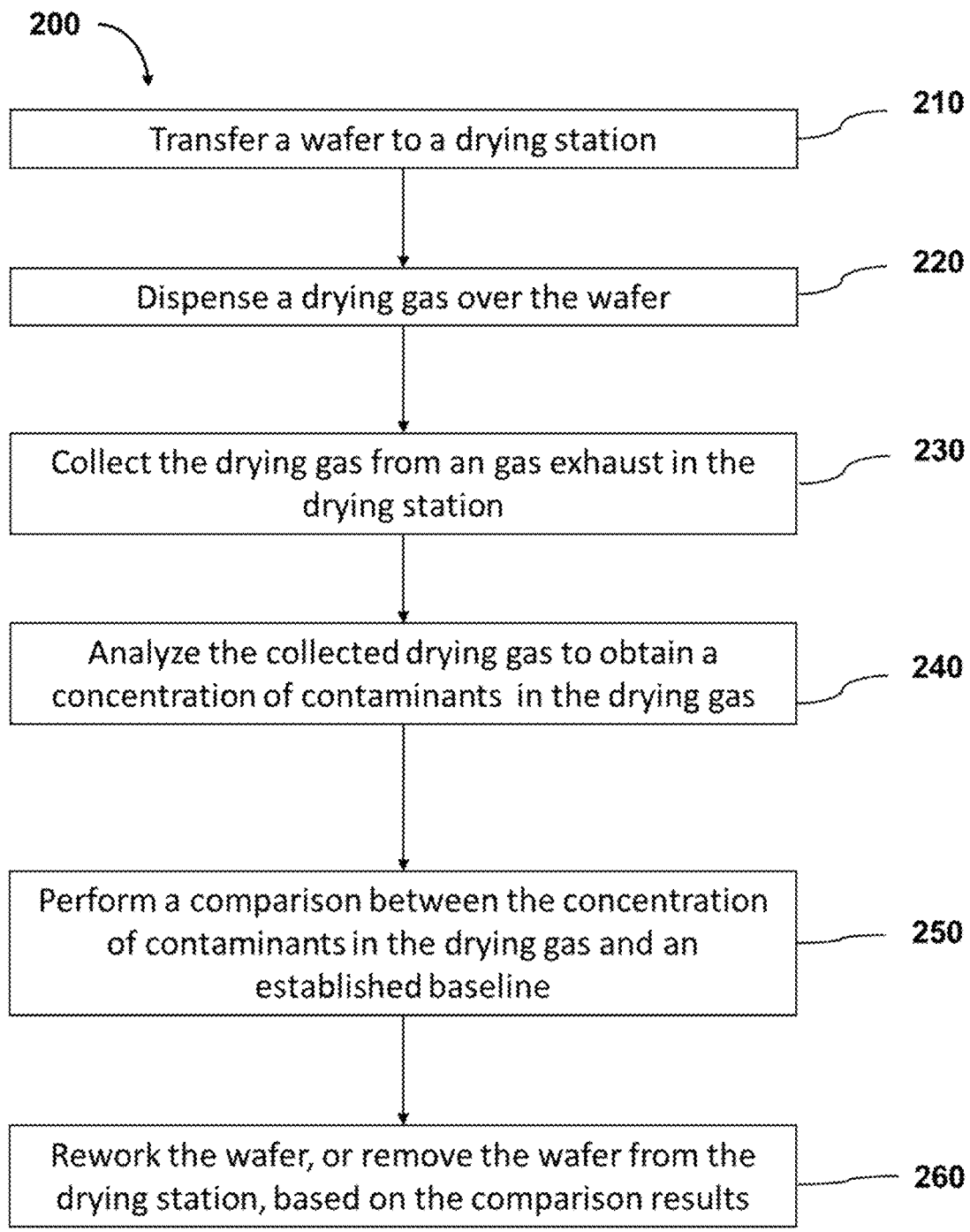
FIG. 2 is flow chart of a wafer drying method, according to some embodiments.

FIG. 2 is a flow chart of a wafer drying method 200 that detects airborne molecular contaminants in a drying gas as a feedback parameter for a wafer drying process, according to some embodiments. In some embodiments, wafer drying method 200 can be performed in single-wafer drying station, like drying station 100 shown in FIG. 1, or a multiple wafer drying station that can handle more than one wafer at a time—e.g., a batch of wafers. Further, this disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than shown in FIG. 2. In some implementations, one or more other operations may be performed in addition to or in place of the presently described operations. For illustrative purposes, wafer drying method 200 is described with reference to the embodiments shown in FIGS. 1 and 3. Based on the disclosure herein, other configurations of single-wafer drying station 100 or drying stations that are configured to dry batches of wafers at a time, as discussed above, can be used with wafer drying method 200 as long as at least one drying gas is participating in the wafer drying process. These wafer drying stations and their configurations are within the spirit and scope of this disclosure.

Figure 3:
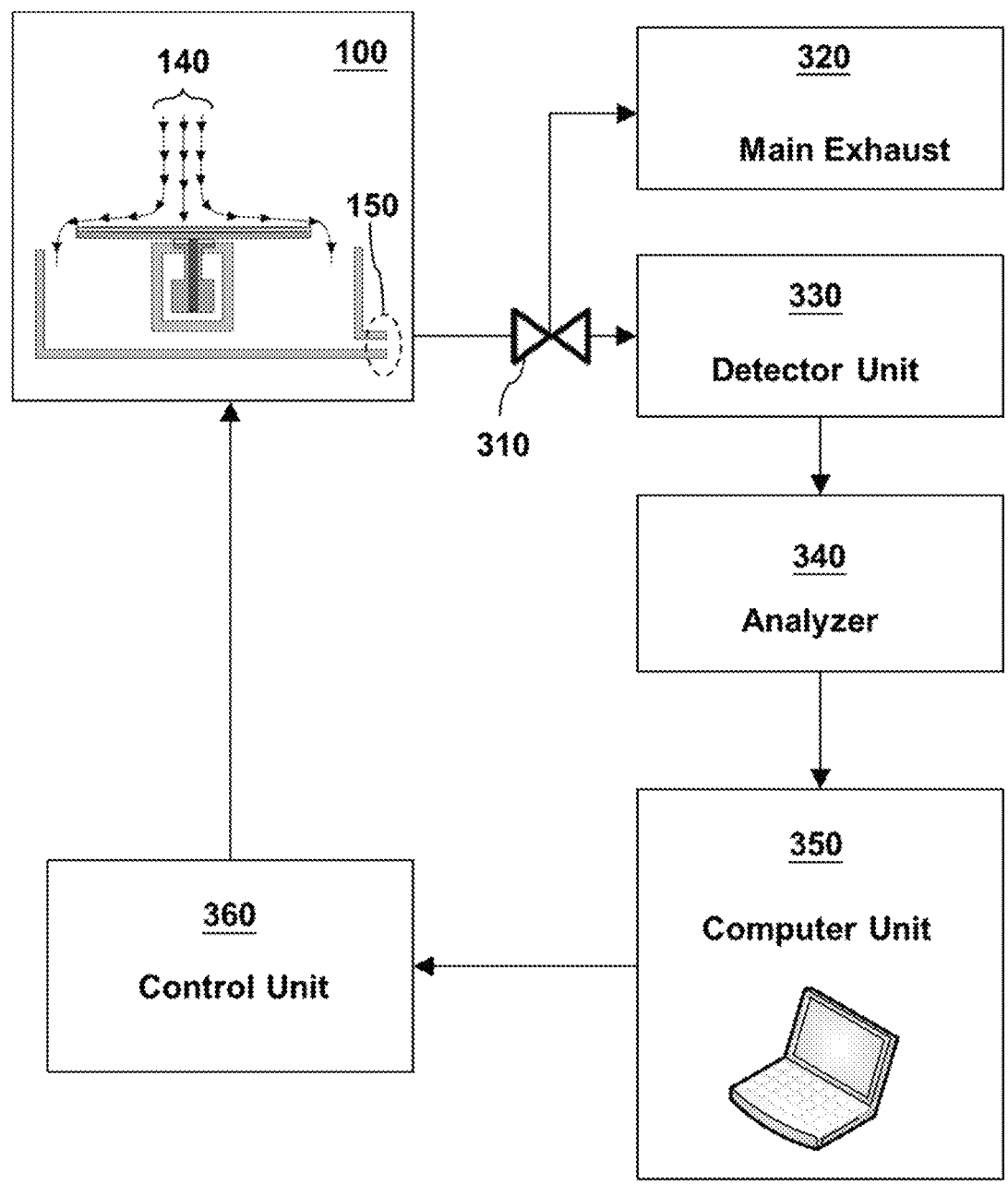
FIG. 3 is a wafer drying system, according to some embodiments.

Wafer drying method 200 begins with operation 210, where a wafer (e.g., wafer 110) is transferred to drying station 100 shown, for example, in FIGS. 1 and 3. By way of example and not limitation, wafer 110 can be transferred to drying station 100 from a transfer module, a wet cleaning station, or from another module—all of which are not shown in FIGS. 1 and 3 for simplicity. As discussed above, drying station 100 can be integrated in a cluster tool. The cluster tool can be a wet cleaning tool that includes one or more cleaning stations, other modules (e.g., transfer modules), mechanical equipment, pneumatic equipment, electrical equipment, or other equipment required for operation. In some embodiments, wafer 110 is transferred to drying station 100 from a wet cleaning station. According to some embodiments, drying station 100 can function as a wet cleaning station, or include additional components that are not depicted in FIGS. 1 and 3.

In operation 220 of wafer drying method 200, a drying gas (e.g., drying gas 140 shown in FIG. 1) is dispensed over wafer 110 in wafer drying station 100. In some embodiments, drying gas 140 is dispensed through one or more gas outlets located over wafer 110. In some embodiments, drying gas 140 can be dispensed from a central location above wafer 110 and cascade downwards towards the surface of wafer 110 as shown by flow lines 170, as shown in FIG. 1. Upon reaching the surface, drying gas 140 can flow parallel to the wafer's top surface. However this is not limiting and other configurations are possible, where the flow lines of drying gas 140 are different from the ones shown in FIG. 1. Regardless of the configuration or the position of the gas outlet relative to the position of wafer 110, drying gas 140 can flow across the surface of wafer 110 before exiting drying station 100 through exhaust line 150. In some embodiments, a drying process involves rotating wafer 110 at a predetermined speed and concurrently dispensing drying gas 140 on the surface of the wafer at a predetermined rate. By way of example and not limitation, drying gas 140 can include an inert gas such as nitrogen, helium, or argon. Alternatively, drying gas 140 can include dry clean air.

As drying gas 140 travels along the surface of spinning wafer 110, airborne molecular contaminants can be incorporated, dissolved, or suspended in drying gas 140. In other words, drying gas 140 can function as a "carrier gas" that transports the airborne molecular contaminants away from the wafer's surface, but does not chemically react with them. By way of example and not limitation, the airborne molecular contaminants can include volatile organic compounds, derivatives of ammonia (e.g., amines), acids (such as hydrofluoric acid, hydrochloric acid. etc.), acetone, sulfur dioxide, isopropyl alcohol, water vapors, other types of chemicals that have been used in a prior wafer wet cleaning operation, or combinations thereof. Based on the type of airborne molecular contaminants to be detected, a selection of an appropriate drying gas can be made. For example, the drying gas should not chemically react with the airborne molecular contaminants because such reaction can result in the formation of deposits on the wafer's surface or in alteration of the airborne molecular contaminants. For example, dry clean air may not be appropriate for certain categories of airborne molecular contaminants due to its reactivity. Referring to FIGS. 1 and 3, drying gas 140 may exit drying station 100 via exhaust line 150.

Wafer drying method 200 continues with operation 230, where drying gas 140 can be collected from the station's exhaust line 150. In referring to FIG. 3, drying gas 140 can be diverted from main exhaust 320 (e.g., via a valve 310) to a detector unit 330, according to some embodiments. By way of example and not limitation, detector unit 330 can be an intermediate station, where drying gas 140 can be chemically identified and temporarily stored until a predetermined volume of drying gas 140 has been collected. For example, detector unit 330 can determine whether drying gas 140 is nitrogen, helium, argon, clean dry air, or another gas. In some embodiments, one or more detector units 330 may be used to collect drying gases from respective one or more drying stations.

In operation 240 of wafer drying method 200, the collected drying gas 140 can be analyzed to obtain a concentration of contaminants incorporated in drying gas 140. In some embodiments, in operation 240, the contaminants are airborne molecular contaminants in drying gas 140 that can be identified and quantified. For example, and referring to FIG. 3, drying gas 140 is transferred from detector unit 330 to one or more analyzers 340. In some embodiments, analyzer 340 can detect more than one type of airborne molecular contaminant. In other embodiments, analyzer 340 may be limited to detecting a single type of airborne molecular contaminants (e.g., volatile organic compounds). Consequently, one or more analyzers 340 may be required for the detection of additional types of multiple airborne molecular contaminants in drying gas 140 (e.g., inorganic contaminants). Further, each analyzer 340 can be configured to receive samples of drying gas 140 from one or more detector units 330. In some embodiments, the one or more analyzers 340 can be disposed within or be part of detector unit 330.

In some embodiments, analyzer 340 includes a time of flight mass spectrometer for volatile organic compound detection, an ion mobility spectrometer for amine and acid detection, other types of detectors for sulfuric oxide detection, humidity detectors, other types of detectors depending on the airborne molecular contaminants of interest, or combinations thereof. In some embodiments, analyzer 340 can provide concentration levels of airborne molecular contaminants incorporated into drying gas 140 in parts per million (ppm), parts per billion (ppb), in atomic percentage (at. %), in a percentage by volume, or other suitable units.

In referring to FIG. 3 and operation 250 of wafer drying method 200 of FIG. 2, the concentration data of the airborne molecular contaminants from analyzer 340 can be sent to a computer unit or circuitry 350, where the concentration data can be compared to an established baseline. By way of example and not limitation, the established baseline can include allowable levels of contamination for airborne molecular contaminants in drying gas 140. The allowable levels of contamination can be the result of a correlation between historical contamination data and the contamination's impact on yield and/or between historical contamination data and the contamination's impact on subsequent operations or processes. In some embodiments, the established baseline for each airborne molecular contaminant in drying gas 104 can be different. Further, the established baseline can be adjusted depending on the type of airborne molecular contaminants and the contaminant's impact on yield or the overall yield goals. By way of example and not limitation, the established baseline can be one or more stored values in a database or a server. In some embodiments, the established baseline can be one or more stored values on a local storage medium, such as a hard drive in computer unit 350.

By way of example and not limitation, computer unit 350, shown in FIG. 3, can be integrated with wafer drying station 100 or an integral part of the cluster tool that includes wafer drying station 100 and additional modules. Alternatively, computer unit 350 can be a remote unit, such as a server or a server network. Further, computer unit 350 can be an integral part of a network system that collects and analyzes data from a variety of sources, such as, but not limited to, cluster tools, pressure sensors, analytical tools, mass flow controllers, and the like. In some embodiments, computer unit 350 can be configured to receive output data from one or more analyzers 340, compare the output data to baseline data, and provide commands to other units or modules based on the results of the comparative analysis it performs.

In operation 260 of wafer drying method 200, wafer 110 can be reworked or removed from dry station 100 based on the comparison analysis in operation 250. In some embodiments, the rework process can include subjecting wafer 110 to a deionized water rinse and a subsequent wafer dry process in drying station 100 or subjecting wafer 110 to a wafer drying process in drying station 100. For example, referring to FIG. 3, computer unit 350 can send one or more commands to a control unit 360 to either rework wafer 110 in drying station 100 or remove wafer 110 from drying station 100. In some embodiments, control unit 360 can be a communication interface between computer unit 350 and drying station 100. In some embodiments, control unit 360 can be integrated with (e.g., a part of) the wet cleaning cluster tool.

In some embodiments, if the concentration of the airborne molecular contaminants in drying gas 140 is equal to or below the established baseline, wafer 110 can be removed from drying station 100. On the other hand, if the concentration of the airborne molecular contaminants in drying gas 140 is above the established baseline, wafer 110 can be either rinsed with deionized water and dried or subjected to a drying process without a prior rinse. For example, if the concentration of volatile organic compounds, amines, or sulfuric oxide is above the established baseline for these contaminants, computer unit 350 can command control unit 360 to subject the wafer to a deionized water rinse followed by a drying cycle in drying station 100. The drying cycle can include spinning the wafer in drying station 100 and disposing drying gas 140 over the rotating wafer. On the other hand, if the measured humidity levels of drying gas 140 are above the allowable levels, computer unit 350 can command cluster control unit 360 to subject the wafer to a drying cycle without a deionized water rinse.

In some embodiments, after the rework process, the drying gas used in the rework operation can be analyzed for airborne molecular contaminants according to the operations of wafer drying method 200. This is to ensure that the rework operation has removed the targeted contaminants from the surface of the wafer.

As discussed above, wafer drying method 200 can be applied to stations that can dry multiple wafers at a time (e.g., multi-wafer drying stations). For example, in operation 210 of wafer drying method 200 of FIG. 2, the wafers can be transferred to a multi-wafer drying station. Similar to the case of a single wafer, the wafers are transferred to a holder. The wafer holder in the multi-wafer drying station can stack the wafers vertically or laterally. In some embodiments, the holder can hold 25 wafers or more at a time. In operation 220, a drying gas is dispensed over the wafers. In some embodiments, during the drying process, the wafers spin while the drying gas is released. In operation 230 of wafer drying method 200, the drying gas is collected via a gas exhaust in the multi-wafer drying station. In some embodiments, the drying gas can be sampled and analyzed for airborne molecular contaminants using operations 240 through 250 of wafer drying method 200. For example, the same or similar detector units 330, analyzers 340 and/or computer units 350 of FIG. 3 can be utilized to perform operations 240 and 250. Further, in operation 260 of wafer drying method 200, the wafers in the multi-wafer drying station can be reworked or removed from the multi-wafer drying station based on the comparison results from operation 250. In FIG. 3, control unit 360 can be a communication interface between computer unit 350 and the multi-wafer drying station. In some embodiments, control unit 360 can be a batch wet cleaning cluster tool with multi-wafer drying stations.

This disclosure is directed to a wafer drying method that detects (e.g., real-time detection) airborne molecular contaminants in a drying gas as a feedback parameter for a single wafer or multi-wafer drying process. More specifically, the method includes collecting the drying gas from a single-wafer and/or a multi-wafer drying station, analyzing the drying gas to determine its airborne molecular contamination concentration, and comparing the concentration to one or more established baseline values. According to the comparison results, the method can make adjustments to the wafer drying process. For example, if the concentration of airborne molecular contamination in the drying gas is equal to or below the established baseline, the wafer (or wafers) can be removed from the single-wafer (or multi-wafer) drying station and transferred to the next processing operation. If the concentration of airborne molecular contamination is above the established baseline, the wafer (or wafers) can be subjected to an additional rinse with deionized water and additional drying operation or subjected to an additional drying operation. In some embodiments, the airborne molecular contamination includes, but is not limited to, volatile organic compounds, amines, inorganic acids, acetone, sulfur dioxide ($SO_2$), isopropyl alcohol (IPA), water vapors (humidity), etc. In some embodiments, the drying gas includes, but is not limited to, nitrogen, argon, helium, clean dry air, or any other suitable gas that does not chemically react with the airborne molecular contaminants to form deposits on the wafers.

In some embodiments a wafer drying system includes a wafer drying station configured to dispense a drying gas over one or more wafers to dry the one or more wafers, an analyzer configured to detect contamination in the drying gas and determine the concentration of the contamination in the drying gas; and a circuitry. The circuitry is further configured to compare the concentration of the contamination to a baseline value, command the wafer drying station to remove the one or more wafers in response to the concentration being equal to or less than the baseline value, and command the wafer drying station to dry the one or more wafers in response to the concentration being greater than the baseline value.

In some embodiments, a method of drying wafers, includes dispensing in a wafer drying station a drying gas over one or more wafers; collecting the drying gas from an exhaust of the wafer drying station; determining the concentration of contaminants in the drying gas; re-dispensing the drying gas over the one or more wafers in response to the concentration of contaminants being higher than a baseline value; and transferring the one or more wafers out of the wafer drying station in response to the concentration being equal to or less than the baseline value.

In some embodiments, a wafer drying system includes a wafer drying station configured to dispense a drying gas over one or more wafers; a detector configured to collect from an exhaust line of the wafer drying station the drying gas that has been dispensed over the one or more wafers; one or more analyzers configured to analyze the collected drying gas and output the concentration of airborne molecular contaminants dissolved in the drying gas. The wafer drying system also includes a circuitry that is configured to compare the concentration of airborne molecular contaminants to one or more baseline values; command the wafer drying station to remove the one or more wafers from the drying station in response to the concentration of airborne molecular contaminants being equal to or less than the baseline value; and command the wafer drying station to re-dispense the drying gas over the one or more wafers in response to the concentration of airborne molecular contaminants being greater than the baseline value.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A wafer drying system, comprising:
a wafer drying station configured to dispense a drying gas over one or more wafers to dry the one or more wafers, wherein the wafer drying station comprises an outlet;
an exhaust line configured to exhaust a first portion of the drying gas;
a detector configured to receive and determine a gas chemistry of a second portion of the drying gas;
a valve between the outlet and the exhaust line and between the outlet and the detector, wherein the valve is configured to divert the first and second portions of the drying gas to the exhaust line and detector, respectively; and
an analyzer configured to measure a concentration of a contaminant in the second portion of the drying gas; and
a computing unit configured to:
compare the concentration of the contaminant to a baseline value;
in response to the concentration of the contaminant being equal to or less than the baseline value, command the wafer drying station to remove the one or more wafers; and
in response to the concentration of the contaminant being greater than the baseline value, command the wafer drying station to continue drying the one or more wafers.

2. The wafer drying system of claim 1, wherein the computing unit is further configured to, in response to the concentration of the contaminant being greater than the baseline value, command the wafer drying station to rinse the one or more wafers with deionized water.

3. The wafer drying system of claim 1, wherein the contaminant is any one selected from the group of volatile organic compounds, amines, inorganic acids, acetone, sulfur dioxide, isopropyl alcohol, water vapors, and any combination thereof.

4. The wafer drying system of claim 1; wherein the drying gas comprises an inert gas.

5. The wafer drying system of claim 4, wherein the inert gas comprises argon.

6. The wafer drying system of claim 1, wherein the analyzer is any one selected from the group of a time of flight mass spectrometer, an ion mobility spectrometer, and a humidity detector.

7. The wafer drying system of claim 1, further comprising a cluster tool that houses the wafer drying station and the computing unit.

8. A method of drying wafers, comprising:
dispensing, in a wafer drying station, a drying gas over one or more wafers;
diverting a first portion of the drying gas to an exhaust line and a second portion of the drying gas to a detector;
exhausting, via the exhaust line, the first portion of the drying gas from the wafer drying station;
collecting, in the detector, the second portion of the drying gas to determine a gas chemistry, of the second portion of the drying gas;
measuring, with an analyzer, a concentration of a contaminant in the second portion of the drying gas;
in response to the concentration of the contaminants being higher than a baseline value,
re-dispensing the drying gas over the one or more wafers; and in response to the concentration of the contaminant being equal to or less than the baseline value, transferring the one or more wafers out of the wafer drying station.

9. The method of claim 8, wherein the contaminant comprises one or more airborne molecular contaminants in the second portion of the drying gas.

10. The method of claim 8, further comprising, in response to the concentration of the contaminant being higher than the baseline value, rinsing the one or more wafers with deionized water.

11. The method of claim 8, further comprising:
spinning the one or more waters while dispensing and re-dispensing the drying gas over the one or more wafers.

12. The method of claim 8, wherein the contaminant is any one selected from the group of volatile organic compounds, amines, inorganic acids,
acetone, sulfur dioxide, isopropyl alcohol, water vapors, and any combination thereof.

13. The method of claim 8, wherein the drying gas comprises clean dry, air.

14. The method of claim 8, further comprising:
after re-dispensing the drying gas over the one or more wafers, exhausting a first portion of the re-dispensed drying gas;
collecting; in the detector; a second portion of the re-dispensed drying gas from the wafer drying station;
measuring, with the analyzer, another concentration of the contaminant in the second portion of the re-dispensed drying gas;
in response to the other concentration of the contaminant being higher than the baseline value, performing another dispensing of the drying gas over the one or more wafers; and
in response to the other concentration of the contaminant being equal to or less than the baseline value, transferring the one or more wafers out of the wafer drying station.

15. A wafer drying system, comprising:
a wafer drying station configured to dispense a drying gas over one or more wafers;
a detector configured to receive, from a valve coupled to an exhaust line of the wafer drying station, a portion of the drying gas dispensed over the one or more wafers, wherein the detector is further configured to determine a gas chemistry of the portion of the drying gas;
one or more analyzers configured to determine a concentration of an airborne molecular contaminant in the portion of the drying gas; and
a computer unit configured to:
receive the concentration of the airborne molecular contaminant from the one or more analyzers;
compare the concentration of the airborne molecular contaminant to one or more baseline values;
in response to the concentration of the airborne molecular contaminant being equal to or less than the baseline value, command the wafer drying station to remove the one or more wafers from the wafer drying station; and
in response to the concentration of the airborne molecular contaminant being greater than the baseline value, command the wafer drying station to continue dispensing the drying gas over the one or more wafers.

16. The wafer drying system of claim 15, wherein the computer unit is further configured to, in response to the concentration of the airborne molecular contaminant being greater than the baseline value, command the wafer drying station to rinse the one or more wafers with deionized water.

17. The wafer drying system of claim 16, wherein the wafer drying station is further configured to dispense deionized water over the one or more wafers in response to receiving a command from the computer unit.

18. The wafer drying system of claim 15, wherein each of the one or more analyzers is configured to Moil determine a concentration of one or more airborne molecular contaminants.

19. The wafer drying system of claim 15, wherein the airborne molecular contaminant is any one selected from the group of volatile organic compounds, amities, inorganic acids, acetone, sulfur dioxide, isopropyl alcohol, water vapors, and any combination thereof.

20. The wafer drying system of claim 15, wherein the drying gas comprises nitrogen.

* * * * *

UNITED STATES PATENT AND TRADEMARK OFFICE
CERTIFICATE OF CORRECTION

PATENT NO. : 10,962,285 B2  
APPLICATION NO. : 16/034526  
DATED : March 30, 2021  
INVENTOR(S) : Hsu et al.

Page 1 of 1

It is certified that error appears in the above-identified patent and that said Letters Patent is hereby corrected as shown below:

In Column 6, Line 13, delete "acid." and insert --acid,--, therefor.

In Column 10, Claim 1, Lines 14-15, delete "respectively; and" and insert --respectively;--, therefor.

In Column 10, Claim 4, Line 41, delete "claim 1;" and insert --claim 1,--, therefor.

In Column 10, Claim 8, Line 64, delete "contaminants" and insert --contaminant--, therefor.

In Column 11, Claim 11, Line 12, delete "waters" and insert --wafers--, therefor.

In Column 11, Claim 13, Line 21, delete "dry, air." and insert --dry air.--, therefor.

In Column 11, Claim 14, Line 26, delete "collecting;" and insert --collecting,--, therefor.

In Column 11, Claim 14, Line 26, delete "detector;" and insert --detector,--, therefor.

In Column 11, Claim 14, Line 27, delete "re-dispended" and insert --re-dispensed--, therefor.

In Column 12, Claim 18, Line 33, delete "to Moil" and insert --to--, therefor.

In Column 12, Claim 19, Line 38, delete "amities," and insert --amines,--, therefor.

Signed and Sealed this  
Fifteenth Day of June, 2021

Drew Hirshfeld  
*Performing the Functions and Duties of the*  
*Under Secretary of Commerce for Intellectual Property and*  
*Director of the United States Patent and Trademark Office*